(12) United States Patent
Takeuchi

(10) Patent No.: US 11,994,552 B2
(45) Date of Patent: May 28, 2024

(54) BURN-IN BOARD AND BURN-IN APPARATUS

(71) Applicant: ADVANTEST Corporation, Tokyo (JP)

(72) Inventor: Hiroaki Takeuchi, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 17/704,281

(22) Filed: Mar. 25, 2022

(65) Prior Publication Data

US 2022/0334177 A1    Oct. 20, 2022

(30) Foreign Application Priority Data

Apr. 19, 2021 (JP) ................................. 2021-070496

(51) Int. Cl.
*G01R 31/28* (2006.01)

(52) U.S. Cl.
CPC ..... *G01R 31/2886* (2013.01); *G01R 31/2831* (2013.01); *G01R 31/2863* (2013.01); *G01R 31/2874* (2013.01); *H01L 2924/00* (2013.01); *H01L 2924/00014* (2013.01); *H01L 2924/14* (2013.01)

(58) Field of Classification Search
CPC ............ G01R 31/2886; G01R 31/2874; G01R 1/0408; G01R 31/2889; G01R 31/2855; G01R 1/0416; G01R 31/00; G01R 31/2884; G01R 31/2879; G01R 23/165; G01R 31/2863; G01R 31/2831; H01L 2924/00; H01L 2924/14; H01L 2924/00014

USPC ......... 324/71, 378, 403, 415, 425, 500, 537, 324/750.01, 750.03, 750.05
See application file for complete search history.

(56) References Cited

U.S. PATENT DOCUMENTS

| 2002/0073370 | A1* | 6/2002 | Akram ............... | G01R 31/2862 714/724 |
| 2006/0125504 | A1* | 6/2006 | Tan ........................ | H05K 1/029 324/750.05 |
| 2008/0048684 | A1* | 2/2008 | Munt ................. | G01R 31/2863 324/750.05 |
| 2009/0035881 | A1* | 2/2009 | Yamashita ......... | G01R 31/2863 438/11 |
| 2009/0079458 | A1* | 3/2009 | Kato .................. | G01R 31/2863 29/874 |
| 2013/0300444 | A1* | 11/2013 | Wong ................. | G01R 31/2863 324/750.05 |
| 2018/0100892 | A1* | 4/2018 | Song .................. | G01R 31/2879 |

FOREIGN PATENT DOCUMENTS

| JP | 2014-025829 A | 2/2014 |
| TW | 201142320 A | 12/2011 |

OTHER PUBLICATIONS

Office Action issued in corresponding Taiwanese Patent Application No. TW 111109354 A dated Oct. 17, 2022 (4 pages).

* cited by examiner

*Primary Examiner* — Raul J Rios Russo
(74) *Attorney, Agent, or Firm* — Osha Bergman Watanabe & Burton LLP

(57) ABSTRACT

A burn-in board includes: a board; a socket mounted on the board; a connector attached to the board; a wiring system that is disposed in the board and that connects the socket and the connector; and a compensation circuit that connects to the wiring system and that compensates a frequency characteristic of a signal transmitted through the wiring system.

6 Claims, 8 Drawing Sheets

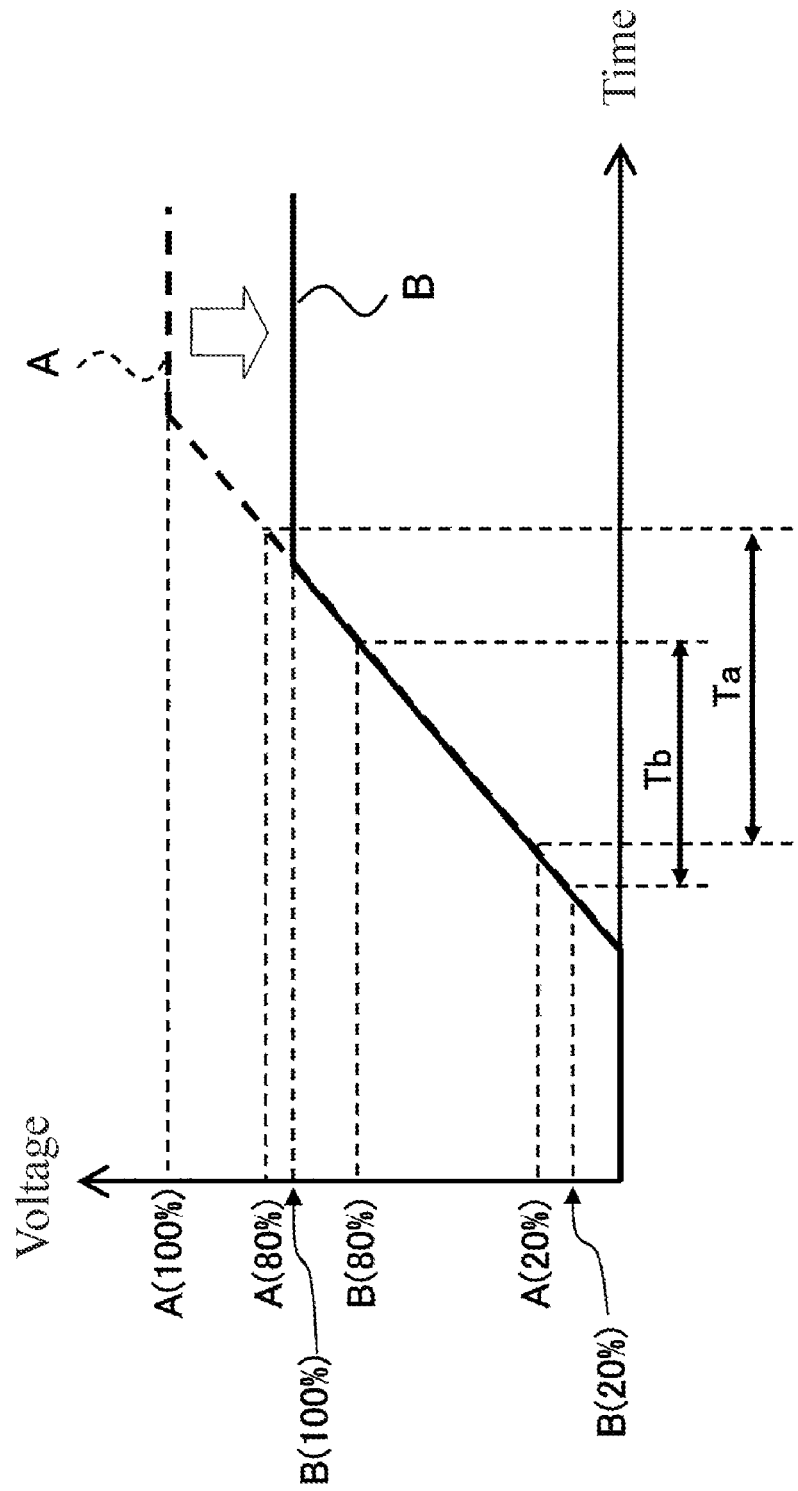

BURN-IN BOARD AND BURN-IN APPARATUS

CROSS-REFERENCE TO RELATED APPLICATIONS

The present application claims priority from Japanese Patent Application No. 2021-070496 filed on Apr. 19, 2021, the contents of which are incorporated herein by reference in their entirety.

BACKGROUND

Technical Field

The present invention relates to a burn-in board for using in a burn-in test of an electronic component under test (DUT: Device Under Test) such as a semiconductor integrated circuit device, and a burn-in apparatus including the burn-in board.

Description Of Related Art

A burn-in apparatus is known that includes a burn-in board having sockets to which DUTs can be respectively mounted, a burn-in chamber that accommodates the burn-in board and applies thermal stress to the DUTs, and a burn-in controller that inputs and outputs signals to and from the DUTs via the burn-in board (refer to, for example, Patent Document 1). The burn-in board has a socket to which DUTs can be mounted and a circuit board on which the socket is mounted, and a plurality of the sachets are arranged on the top surface of the circuit board. In this burn-in apparatus, the burn-in board and the burn-in controller are electrically connected each other by fitting the connector of the burn-in board with the connector of the burn-in chamber.

Patent Document

PATENT DOCUMENT 1: JP 2014-025829 A

The socket described above is connected to the driver of the burn-in controller via a connector, and signals from the driver are input and output to the DUT through the wiring system of the circuit board. Since the number of this driver is limited and sockets are connected to the same driver through the wiring system, the number of sockets is greater than drivers. Since the connector on the burn-in board is located at one end of the circuit board, the wiring length of the wiring system connecting the socket to the connector depends on the position of the socket on the circuit board. Depending on the type of signal input and output from the burn-in controller to the DUT, the difference in the wiring length between these sockets may affect the quality of the burn-in test.

Therefore, when the number of sockets on the burn-in board is increased and the wiring length of the wiring system becomes longer, the quality of the burn-in test may be deteriorated depending on the type of signal since the rise and/or fall time of the signal are delay.

SUMMARY

One or more embodiments of the present invention provide a burn-in board and a burn-in apparatus capable of suppressing the deterioration of the quality of the burn-in test even when the number of sockets is increased.

[1] A burn-in board according to one or more embodiments includes a board, a socket that is mounted on the board, a connector that is mounted on the board, a wiring system that is disposed in the board and connects a plurality of the sockets and a plurality of the connectors, and a compensation circuit that is connected to the wiring system and compensates a frequency characteristic of a signal transmitted through the wiring system.

[2] In one or more embodiments, the compensation circuit may have a filter that reduces the amplitude of the low-frequency side of the signal to less than the amplitude of the high-frequency side.

[3] In one or more embodiments, the wiring system may have a plurality of wirings of which wirings length are different, and the compensation circuit may be connected to the wiring of the longer wiring length among the wirings.

[4] In one or more embodiments, the burn-in board may include an external capacitor connected to the wiring system.

[5] In one or more embodiments, the burn-in board may include an external capacitor that is connected to the wiring system and has a first capacitor and a second capacitor. The wiring system may connect a plurality of the sockets and the connector and may have a plurality of wirings of which wirings length are different, the capacitance of the first capacitor may be greater than that of the second capacitor, the first capacitor may be connected to the wiring of the shorter wiring length among the wirings, and the second capacitor may be connected to the wiring of the longer wiring length among the wirings.

[6] In one or more embodiments, the signal may be a test signal to the DUT electrically connected to the socket, and the frequency characteristic may be set in accordance with (based on) a rise or fall time required for the test signal.

[7] A burn-in apparatus according to one or more embodiments is a burn-in apparatus comprising the burn-in board described above.

According to one or more embodiments, a burn-in board includes a board, a socket that is mounted on the board, a connector that is mounted on the board, a wiring system that is disposed in the board and connects a plurality of the sockets and a plurality of the connectors, and a compensation circuit that is connected to the wiring system and compensates a frequency characteristic of a signal transmitted through the wiring system. Thus, according to one or more embodiments, even when the number of sockets on the burn-in board is increased, it is possible to suppress the deterioration of the test quality of the burn-in test.

BRIEF DESCRIPTION OF DRAWINGS

FIG. 6 is a graph illustrating the rise time of signals transmitting through the wiring circuit in FIG. 4.

DETAILED DESCRIPTION

First Embodiment

Hereinafter, embodiments of the invention will be described with reference to the drawings.

Figure 1:
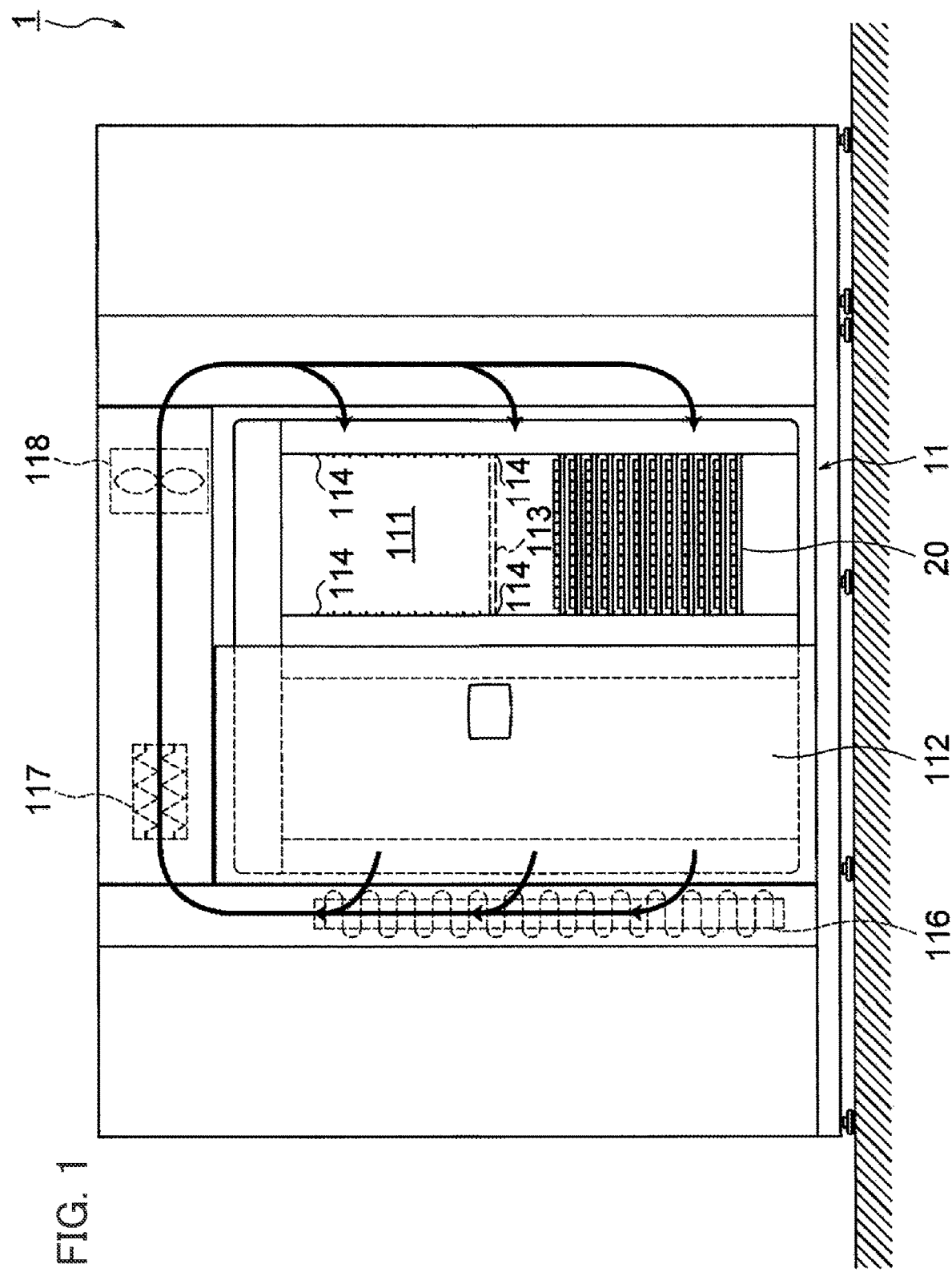
FIG. 1 is a front view illustrating a burn-in apparatus in the first embodiment of the present invention.
Figure 2:
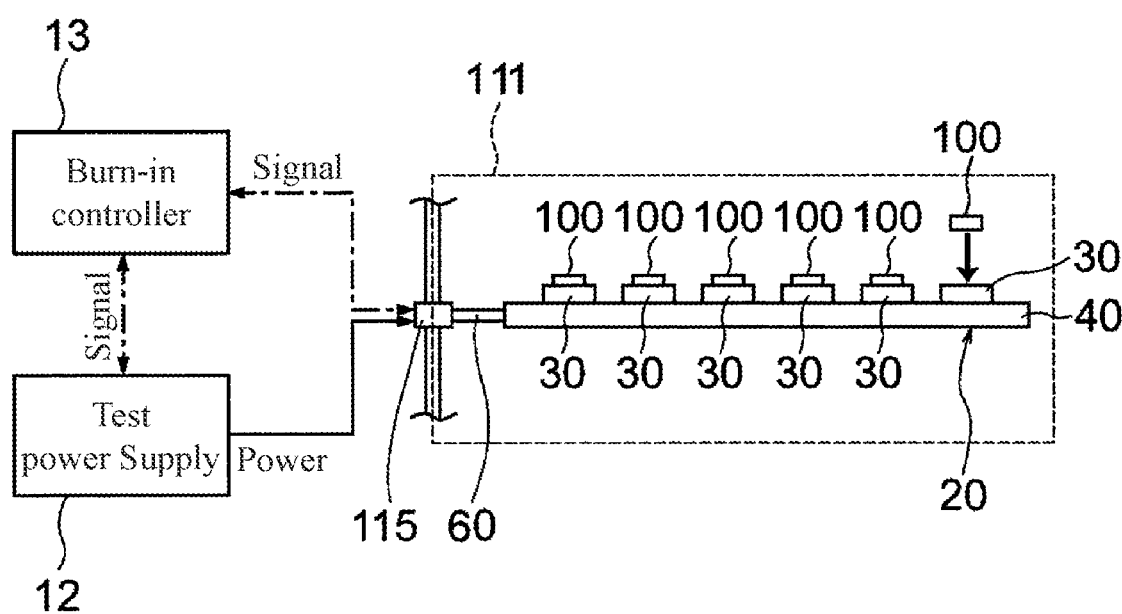
FIG. 2 is a block diagram illustrating a system configuration of the burn-in apparatus in the first embodiment of the present invention.

First, an overall configuration of a burn-in apparatus 1 of the first embodiment will be described with reference to FIGS. 1-2. FIG. 1 is a front view of the burn-in apparatus in the present embodiment, and FIG. 2 is a block diagram illustrating a system configuration of the burn-in apparatus of the present embodiment.

The burn-in apparatus 1 of the present embodiment is an apparatus that performs a burn-in test that is a kind of screening test for extracting an initial defect of a DUT such as an IC chip and removing an initial defective product. As illustrated in FIGS. 1-2, the burn-in apparatus 1 includes a burn-in chamber 11 that accommodates a burn-in board 20, a test power supply 12 that applies a power voltage to a DUT 100 (see FIG. 2) mounted on the burn-in board 20, and a burn-in controller 13 that inputs and outputs signals to the DUT 100.

The burn-in apparatus 1 performs screening on the DUT 100 by applying the power supply voltage and inputting and outputting the signals to and from the DUT 100 while applying thermal stress (for example, about −25° C. to +125° C.) to the DUT 100 mounted on the burn-in board 20 accommodated in the burn-in chamber 11. The DUT 100 in the present embodiment is a memory device. The DUT 100 to be tested is not particularly limited, but may be, for example, a logic device and a SoC (System on a chip).

As illustrated in FIG. 1, the burn-in chamber 11 includes a thermostatic room 111 that is defined by a heat insulation wall or the like, and a door 112 capable of opening and closing the thermostatic room 111. A plurality of slots 113 for holding the burn-in boards 20 are disposed in the thermostatic room 111. Each of the slots 113 includes a pair of rails 114 supporting both right and left ends of the burn-in board 20. The burn-in board 20 is carried into the thermostatic room 111 through the door 112 while sliding on the rails 114. In the thermostatic room 111, the two rows of twenty four stages of slots 113 are disposed to accommodate the forty eight burn-in boards 20 in total.

In the figure, one door (the door on the right side in the figure) is not shown, but is shown in a state where the thermostatic room 111 is open. On the other hand, the other door 112 (the door on the left side in the figure) is shown in a closed state, and the twenty four stages of slots 113 on the left side in the figure is not shown. The number and arrangement of the slots 113 (that is, the number and positional relationship of the burn-in boards 20 accommodated in the thermostatic room 111) is not limited to the example illustrated in FIG. 1 and can be arbitrarily set in consideration of the test efficiency and the like.

A connector 115 (see FIG. 2) is disposed inside each of the slots 113. A connector 80 of the burn-in board 20 inserted into the slot 113 can be fitted to the connector 115.

As illustrated in FIG. 2, the connector 115 is electrically connected to the DUT power supply 12 and the burn-in controller 13. Only one burn-in board 20 is illustrated in FIG. 2, but the other burn-in boards 20 are also connected to the DUT power supply 12 and the burn-in controller 13 in the same manner.

Further, as illustrated in FIG. 1, the burn-in chamber 11 includes an evaporator 116, a heater 117, and a fan 118. The air inside the thermostatic room 111 is cooled by the evaporator 116 or heated by the heater 117 while being circulated by the fan 118. Accordingly, temperature inside the thermostatic room 111 is adjusted. The operations of the evaporator 116, the heater 117, and the fan 118 are controlled by the burn-in controller 13.

The DUT power supply 12 is connected to each DUT 100 on the burn-in board 20 via the connectors 115 and 80 so as to apply a power supply voltage to each DUT 100 and is controlled by the burn-in controller 13.

In addition to the control of the voltage applied to the DUT 100, the input and output of the signals to and from the DUT 100, and the control of the temperature adjustment in the thermostatic room 111, the burn-in controller 13 determines the DUT 100 having an abnormal response during a burn-in test as a defective product, stores a serial number (for example, corresponding to the number of the slot 113 and the position on the burn-in board 20) of the DUT 100, and feeds back the test result.

Figure 3:
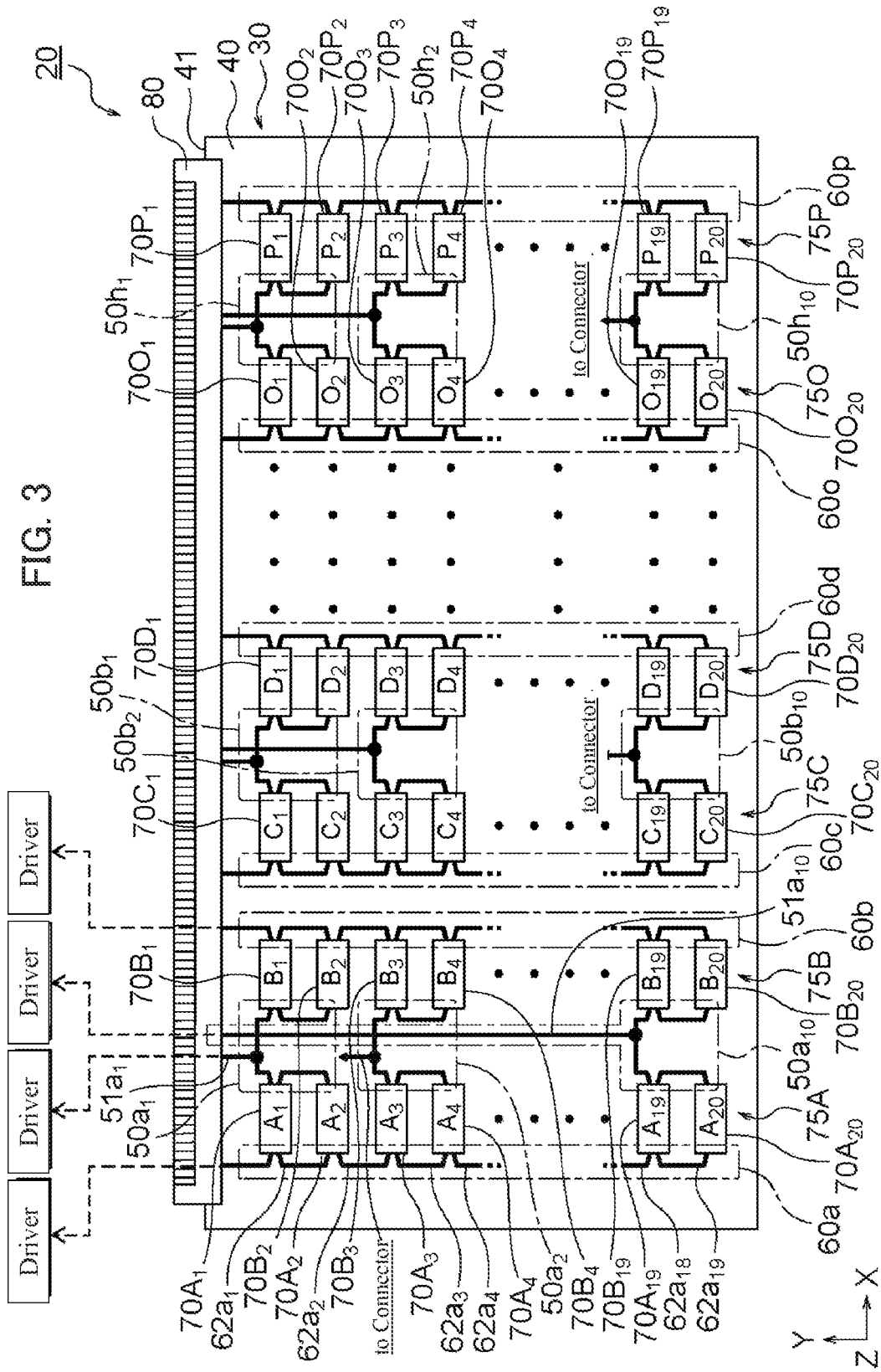
FIG. 3 is a schematic plan view showing the wiring systems of the burn-in board in the first embodiment of the present invention.

Next, the configuration of the burn-in board 20 in the present embodiment will be described with reference to FIG. 3. FIG. 3 is a schematic plan view showing the wiring systems of the burn-in board in the present embodiment.

As shown in FIG. 3, the burn-in-board 20 in the present embodiment includes a wiring board 30, a plurality of (320 in the present embodiment) sockets 70 that are mounted on the wiring board 30, and a connector 80 that is mounted on the wiring board 30.

The DUT 100 can be mounted on each of the sockets 70($A_1$ to $P_{20}$). Hereinafter, the sockets 70($A_1$ to $P_{20}$) will be also collectively referred to as a socket 70 and the individual 70 sockets will be also referred to as $70A_1$ or $70A_2$. Further, the connector 80 is mounted on (attached to) one end (upper edge in FIG. 3) 41 in (of) the board 40 of the wiring board 30 and can fit the connector 115 disposed in the chamber-in chamber 11 as described above. When the connector 80 fits the burn-in chamber 11, the socket 70 electrically connects with the driver that the burn-in controller has via the connector 80. The burn-in board 20 may include a reinforcing frame for reinforcing the wiring board 30, and a bottom cover for protecting the rear surface of the wiring board.

Each of the sockets 70 has a plurality of (16 in the present embodiment) contact pins 71 that come into contact with the terminals of the DUT 100. When the DUT 100 is mounted on the socket 70 for the burn-in test, the contact pin 71 comes into contact with the terminal of the DUT 100 so that the DUT 100 and the socket 70 are electrically connected. The sockets 70A1 to 70P20 have the same structure.

As shown in FIG. 3, the plurality of sockets $70A_1$ to $70P_{20}$ are arranged in a matrix on the board 40 of the wiring board 30.

More specifically, in the present embodiment, twenty sockets $70A_1$ to $70A_{20}$ are arranged in a row along the first direction on the board 40, and one socket row 75A is formed by these sockets $70A_1$ to $70A_{20}$.

Similarly, twenty sockets $70B_1$ to $70B_{20}$ arranged along one direction are arranged in a row, and one socket row 75B is formed by these sockets $70B_1$ to $70B_{20}$. And similarly for the remaining sockets $70C_1$ to $70P_{20}$, 20, twenty sockets 70 each are arranged in a row along the same direction.

The number of sockets 70 mounted on the board 40 is not particularly limited to the above. The arrangement of the sockets 70 on the board 40 is not particularly limited to the above.

The wiring board 30 in the present embodiment is a printed wiring board on which a plurality of sockets $70A_1$ to $70P_{20}$ described above are mounted. As shown in FIG. 3, the wiring board 30 includes a board (substrate) 40 that has an electrical insulating property, and the wiring system 50. In the present embodiment, the wiring board 30 is a multilayer wiring board, and each of the wiring systems 50 is constituted by a conductive path such as a wiring pattern and a via hole formed in the board 40.

In the present embodiment, the type of the connection form of the first wiring systems $50a_1$ to $50h_{10}$ are different from the type of the connection form of the second wiring systems $60a$ to $60p$. Here, the connection form (the connection configuration/the connection topology) is a form of electrical connection between the connector 80 and a plurality of sockets 70 in the wiring board 30 and is represented by the connection path (the positional relationship of the wiring and branch point) configured by combining the wiring and the branch point for connecting the connector 80 and a plurality of sockets 70. It is possible to classify the type of the connection form according to the presence or absence of a branch point and the position of the branch point. In the present embodiment, the first wiring systems $50a_1$ to $50h_{10}$ have a connection form that has a branch point, whereas the second wiring systems $60a$ to $60p$ have a connection form that has no branch point. The number of types of connection forms of the wiring systems included in the wiring board 30 has is not particularly limited, the wiring board may include wiring systems having three or more types of connection forms.

Since the first wiring systems $50a_1$ to $50h_{10}$ have basically the same configuration, the configuration of the first wiring system $50a_1$ will be representatively described below, and description of the configuration of the other first wiring systems $50a_2$ to $50h_{10}$ will be omitted. Similarly, since the second wiring systems $60a$ to $60p$ have basically the same configuration, the configuration of the second wiring system $60a$ will be representatively described below, and the description of the configuration of the other second wiring systems $60b$ to $60p$ will be omitted.

The first wiring system $50a_1$ has a connection form that has a portion in which wiring branches between the connector 80 and the socket $70A_1$ and is connected to the socket $70B_1$. That is, in the first wiring system $50a_1$, the wiring is branched into two between the connector 80 and the socket $70A_1$ and $70B_1$. In the first wiring system $50a_1$, the socket $70A_1$ and the socket $70A_2$ aligned with the socket $70A_1$ along the first direction are connected in a daisy chain shape by wirings. Similarly, in the first wiring system $50a_1$, the socket $70B_1$ and the socket $70B_2$ aligned with the socket $70B_1$ along the Y axis direction are connected in a daisy chain shape by wires.

In the present embodiment, the length of the wiring between the branch point of the first wiring system $50a_1$ and the length of the wiring between the branch point and the socket $70B_1$ are substantially the same. Therefore, the transmission time of the signal of the socket $70A_1$ and the transmission time of the signal of the socket $70B_1$ are substantially the same.

Further, the length of the wiring between the socket $70A_1$ and the socket $70A_2$ and the length of wiring between the socket $70B_1$ and the socket $70B_2$ are substantially the same. Therefore, the total length of the wiring between the branch point of the first wiring system $50a_1$ and the socket $70A_2$ and the wiring connecting the socket $70A_1$ and the socket $70A_2$ in a daisy chain shape and the total length of the wiring between the branch point of the first wiring system $50a_1$ and the socket $70B_2$ and the wiring connecting the socket $70B_1$ and the socket $70B_2$ in a daisy chain shape are substantially the same. Therefore, the transmission time of the signal of the socket $70A_2$ and the transmission time of the signal of the socket $70B_2$ are substantially the same.

The first wiring system $50a_2$ also has the same wiring system as the first wiring system $50a_1$ described above. As shown in FIG. 3, the first wiring system $50a_2$ connects the connector 80 and the four sockets $70A_3$, $70A_4$, $70B_3$ and $70B_4$.

Although not particularly shown, the first wiring systems $50a_3$ to $50a_9$ also have the same wiring system as the first wiring system $50a_1$ described above. The first wiring system $50a_3$ connects the connector 80 and the four sockets $70A_5$, $70A_6$, $70B_5$ and $70B_6$. The first wiring system $50a_4$ connects the connector 80 and the four sockets $70A_7$, $70A_8$, $70B_7$ and $70B_8$. The first wiring system $50a_5$ connects the connector 80 and the four sockets $70A_9$, $70A_{10}$, $70B_9$ and $70B_{10}$. The first wiring system $50a_6$ connects the connector 80 and the four sockets $70A_{11}$, $70A_{12}$, $70B_{11}$ and $70B_{12}$. The first wiring system $50a_7$ connects the connector 80 and the four sockets $70A_{13}$, $70A_{14}$, $70B_{13}$ and $70B_{14}$. The first wiring system $50a_8$ connects the connector 80 and the four sockets $70A_{15}$, $70A_{16}$, $70B_{15}$ and $70B_{16}$. The first wiring system $50a_9$ connects the connector 80 and the four sockets $70A_{17}$, $70A_{18}$, $70B_{17}$ and $70B_{18}$.

The first wiring systems $50a_{10}$ also have the same wiring system as the first wiring system $50a_1$ described above. As shown in FIG. 3, the first wiring systems $50a_{10}$ connects the connector 80 and the four sockets $70A_{19}$, $70A_{20}$, $70B_{19}$ and $70B_{20}$.

That is, ten first connection forms $50a_1$ to $50a_{10}$ each of which connects four sockets 70 and the connector 80 are provided for two socket rows 75A and 75B. Similarly, in the other socket rows 75C to 75P, ten first connection forms $50b_1$ to $50h_{10}$ are provided for every two socket rows. As a result, the burn-in board 20 of the present embodiment includes eighty first connection forms $50a_1$ to $50h_{10}$ for 320 sockets $70A_1$ to $70P_{20}$.

On the other hand, the second wiring system $60a$ has a connection form that does not have a portion in which a wiring branches between the connector 80 and the sockets $70A_1$ to $70A_{20}$. In the second wiring system $60a$, twenty sockets $70A_1$ to $70A_{20}$ constituting the socket row 75A by being aligned in a row along the first direction are connected in a daisy chain shape by the connection lines $62a_1$ to $62a_{19}$.

The second wiring system $60b$ also have the same wiring system as the second wiring system $60a$ described above, and twenty sockets $70B_1$ to $70B_{20}$ constituting the socket row 75B are connected in a daisy chain shape.

Similarly, the second wiring systems $60c$ to $60p$ also have the same wiring system as the second wiring system $60a$ described above, and twenty sockets 70 respectively constituting the socket rows 75C to 75P are connected in a daisy chain shape by each of the second wiring systems $60c$ to $60p$.

On the board 40 of the circuit board 30, the connector 80 is mounted on one end of the board 40 and the sockets 70 are arranged in line along the Y direction. Therefore, of a single row of sockets, socket $70A_1$ is located closest to the connector 70, and socket $70A_{20}$ is located farthest from the connector 70. Therefore, the wiring length of wiring $51a_1$ from the branch point of the first wiring system $50a_{10}$ to the connector 80 is longer than one of the wiring $51a_1$ from the branch point of first wiring system $50a_1$ to the connector 80.

The relationship between the wiring length and the rise and/or fall time of the test signal input/output from the burn-in controller 13 to DUT100 is described below. Since the rise and fall of the test signal is symmetrical, the following explanation is given for the rise of the test signal. The relationship between the wiring length and the rise of the test signal is the same as that between the wiring length and the fall of the test signal, and the explanation is omitted.

Various test signals are used to test the DUT100, depending on the type of test. For example, when testing the clock of the DUT100, the test signal for the DUT100 includes an input signal input to DUT 100. On the other hand, when testing the memory of the DUT 100, for example, the test signal for the DUT100 includes both the input signal input to DUT 100 and an output signal output from DUT 100. Specifically, these test signals including signals for writing data to the DUT100 and signals to read data from the DUT 100 can be illustrated as an example.

Since the test signal for clock testing includes only an input signal, the test speed requirement is low and the rise time of the test signal may be long. On the other hand, the test signal for memory test includes an input signal for reading and an output signal for writing, so the test speed requirement is high and the rise time of the test signal must be short. Therefore, when testing the DUT100 using test signals for memory testing, the input and output signals with short rise and fall times are required.

The rise time of the test signal of the DUT 100 is affected by the wiring length of the wiring connecting the connector 80 to the socket 70. Because the wiring length of wiring $51a_1$ included in the first wiring system $50a_1$, which connects connector 80 to sockets $70A_1, A_2, B_1$, and $B_2$, is short, the attenuation of the signal flowing through the first wiring system $50a_1$ is small. On the other hand, the attenuation of signals flowing through the first wiring system $50a_1$ is large because of the long wiring length of the wiring $51a_{10}$ included in the first wiring system $50a_{10}$ connecting the connector 80 and the sockets $70A_{19}, A_{20}, B_{19}, B_{20}$. The rise time of the test signal flowing through the first wiring system $50a_{10}$ is longer than the rise time of the test signal flowing through the first wiring system $50a_1$. When the socket 70 is arranged on the circuit board 30 as shown in FIG. 3, the DUT 100 connected to the socket 70 closer to the connector 80 can input and output test signals that satisfy the rise time requirement. On the other hand, it may not be possible to input or output a test signal that satisfies the rise time requirement to the DUT100 connected to the socket 70 farther from the connector 80.

Figure 4:
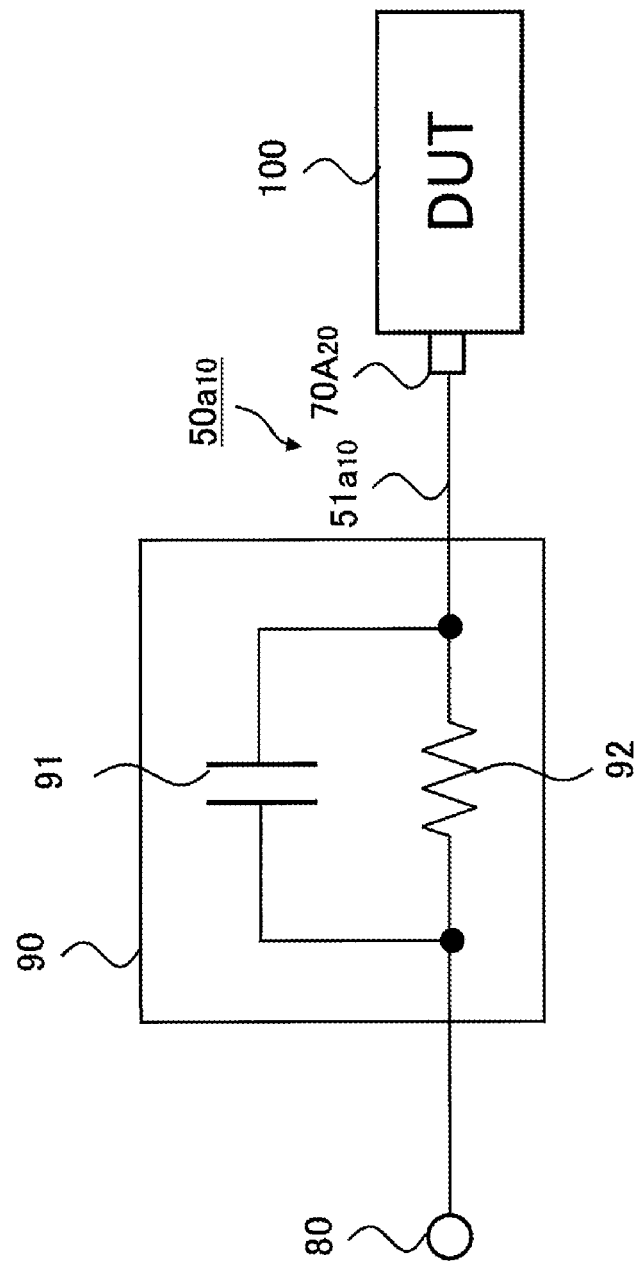
FIG. 4 illustrates a wiring circuit of a burn-in board in the first embodiment of the invention.

In this embodiment, a compensation circuit 90 is provided to shorten the rise time of the test signal in a wiring system with long wiring lengths. FIG. 4 illustrates the wiring circuit between the socket $70A_{20}$ and the connector 80. As shown in FIG. 4, the compensation circuit 90 is connected the wiring system $50a_{10}$ that connects between the connector 80 and the socket $A_{20}$. The compensation circuit 90 is a circuit that compensates the frequency characteristics of the test signal transmitted through the first wiring system $50a_{10}$. The compensation circuit 90 has a parallel circuit with a capacitor 91 and a resistor 92. The parallel circuit with the capacitor 91 and the resistor 92 is an RC filter The compensation circuit 90 is connected to wirings $51a_1$-$51a_{10}$ with longer wiring lengths among the wirings $51a_1$-$51a_{10}$ included in the plurality of first wiring systems $50a_1$-$50a_{10}$, and is connected to at least wiring $50a_{10}$. The wiring $51a_{10}$ is not limited to connect to the compensation circuit 90, but also connects, for example, to a terminating resistor for impedance matching between the input and output sides of the DUT 100. The compensation circuit 90 may also be connected to the first connection forms $50b_1$-$50h_{10}$ or the second connection forms $60a$-$60p$, not limited to the first wiring system $50a_1$-$50a_{10}$.

Figure 5:
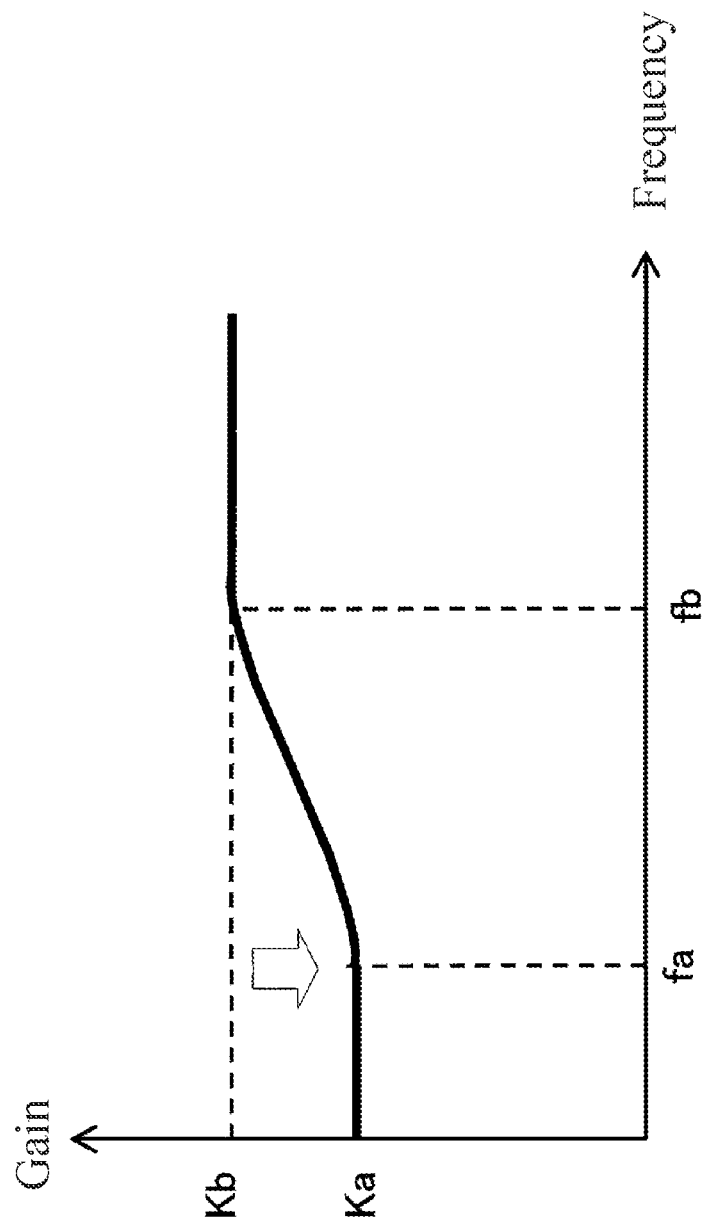
FIG. 5 illustrates a signal characteristic in the wiring circuit of FIG. 4.

FIG. 5 shows the frequency characteristics of the compensation circuit 90, with the horizontal axis representing frequency and the vertical axis representing gain. As shown in FIG. 5, the compensation circuit 90 has functions as a high-pass filter. When the frequency of the test signal is higher than the high side threshold frequency ($f_b$), the compensation circuit 90 transmits the signal with the maximum gain Kb. When the frequency of the test signal is lower than the low side threshold frequency ($f_a$), the compensation circuit 90 transmits the signal with the minimum gain Ka. When the frequency of the test signal is in the range between the high-side threshold frequency ($f_b$) and the low-side threshold frequency ($f_a$), the compensation circuit 90 outputs the signal with a gain between Ka and Kb such that the higher the frequency, the higher the gain. In other words, the compensation circuit 90 reduces the amplitude of the low-frequency side of the signal to less than the amplitude of the high-frequency side. The threshold frequency ($f_a$, $f_b$) and gains Ka, Kb are then set according to the rise time required for the test signal. For example, to make the rise time shorter, the threshold frequency (fa, fb) should be set to a lower value. In other words, the frequency characteristics of the test signal, which are compensated by the compensation circuit 90, are set according to the rise or fall time required for the test signal.

FIG. 6 shows the voltage characteristics of the signal compensated by the compensation circuit 90 and the voltage characteristics of the signal not compensated by the compensation circuit 90. The vertical axis indicates voltage and the horizontal axis indicates time. In FIG. 6, a graph A shows the characteristics of a signal A not compensated by the compensation circuit 90, and a graph B shows the characteristics of signal B compensated by the compensation circuit.

The rise time of the test signal is a time in which the voltage changes between 20% and 80% at the rise when the maximum voltage at the rise of the signal is 100%. In FIG. 6, A (100%) represents the maximum voltage at the rise of signal A, and A (80%) represents 80% of the maximum voltage at the rise of signal A, and A (20%) represents 20% of the maximum voltage at the rise of signal A. B (100%) represents the maximum voltage at the rise of signal B, and B (80%) represents 80% of the voltage relative to the maximum voltage at the rise of signal B, and B (20%) represents 20% of the voltage relative to the maximum voltage at the rise of signal B.

The rise time of the signal not compensated by the compensation circuit 90 is Ta, and the rise time of the signal compensated by the compensation circuit 90 is Tb (<Ta). In the signal waveform at the rise of the test signal, the waveform in the first half of the rise is heavily influenced by the high-frequency component of the signal, while the waveform in the second half of the rise is heavily influenced by the low-frequency component of the signal. The compensation circuit 90 decreases the gain on the low-frequency side and increases the gain on the high-frequency side. Therefore, as shown in FIG. 6, for signal B, the voltage from the start of the rise of signal B until a certain time elapses follows the same characteristics as signal A, but the maximum voltage at the rise of signal B is lower than the maximum voltage of signal A. In other words, the compensation circuit 90 reduces the apparent rise time by suppressing the maximum voltage at the rise without changing the slope of the voltage at the rise of the test signal. This allows the compensation circuit 90 to be connected to long wiring and to shorten the rise time of the test signal in wiring systems with long wiring lengths.

Therefore, in the present embodiment, the burn-in board 20 and the burn-in apparatus 1 comprises the socket 70, the connector 80, the first wiring system $50a_1$ to $50h_{10}$, and/or the second wiring system $60a$ to $60p$, which connect the sockets 70 and the connecters 80, and the compensation circuit 90 that is connected to the wiring system $50a_1$ to $50h_{10}$, and/or the second wiring system $60a$ to $60p$ and compensates a frequency characteristic of a signal transmitted through the wiring system. It is possible to shorten the rise time and/or the fall time of the signal. The burn-in controller 13 adjusts the signal output timing so that all DUTs 100 receive the test signal at the same timing as much as possible. However, if the operating rate is increased, calibration may not work on the tester side, and the timing of signal readings may shift. In particular, the longer the wiring length of the wiring transmitting the signal, the longer the rise and/or fall delay time of the signal, which affects the test performance. In the present embodiment, it is possible to shorten the rise time and/or the fall time of the signal. As a result, even when the number of sockets on the burn-in board is increased, the test quality of the burn-in test can be suppressed.

In the present embodiment, the compensation circuit 90 has a filter that reduces the amplitude of the low-frequency side of the signal to less than the amplitude of the high-frequency side. It is possible to shorten the rise time and/or the fall time of the signal.

In the present embodiment, the wiring system $50a_1$ to $50h_{10}$, and/or the second wiring system $60a$ to $60p$ has a plurality of wirings of which wirings length are different and the compensation circuit 90 is connected to the wiring of the longer wiring length among the wirings. It is possible to shorten the rise time and/or the fall time of the signal.

In the present embodiment, the frequency characteristic compensated by the compensation circuit 90 is set in accordance with a rise and/or fall time required for the test signal. It is possible to shorten the rise time and/or the fall time of the signal.

Second Embodiment

Figure 7A:
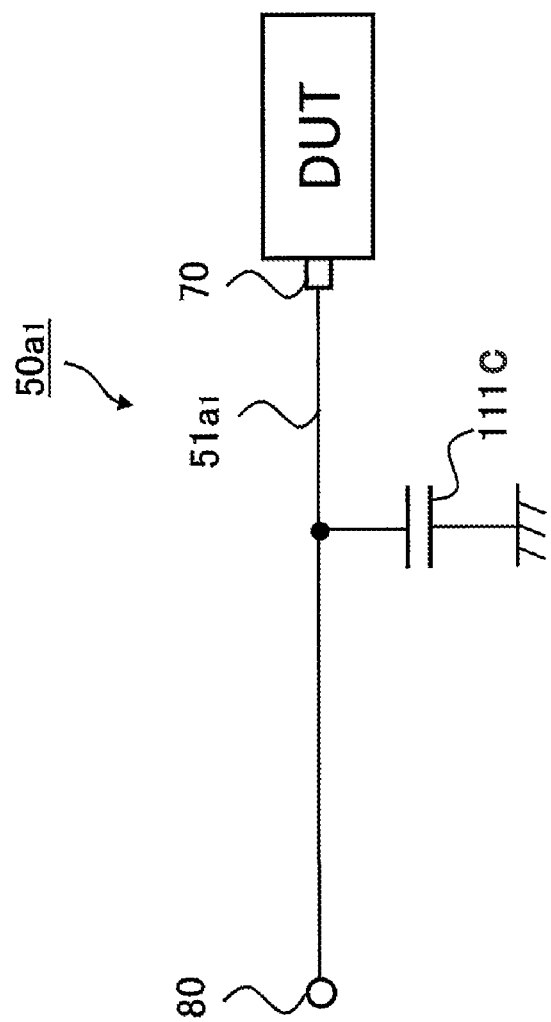
FIGS. 7A-7B illustrate the wiring circuits of the burn-in board in the second embodiment of the invention.
Figure 7B:
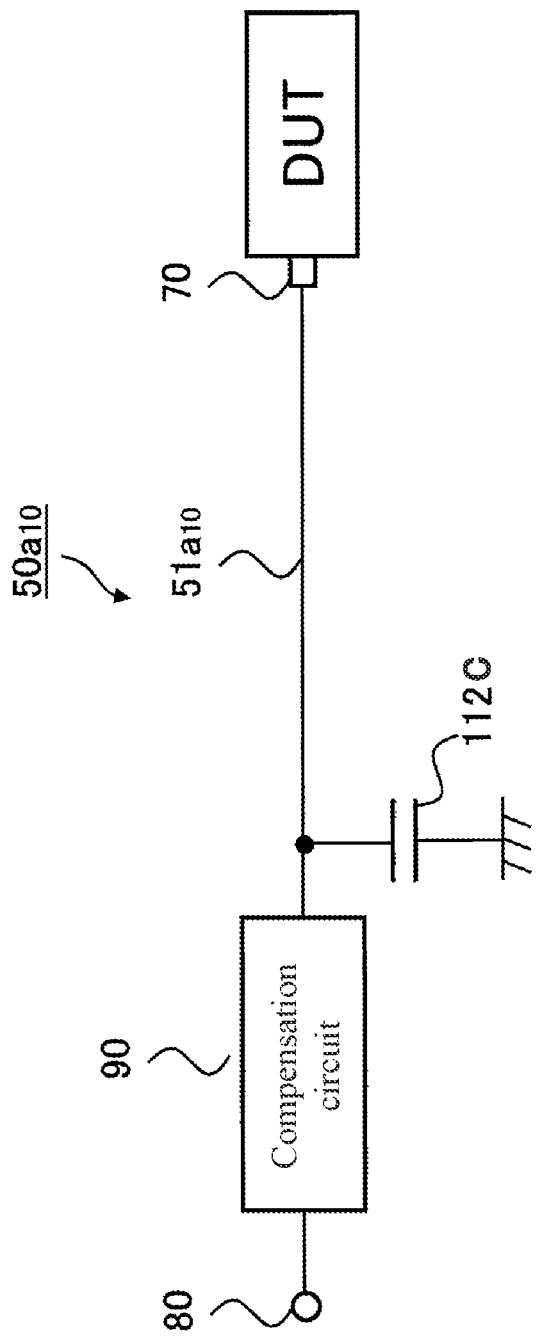

FIGS. 7A-7B illustrate the wiring circuits of the burn-in board in the second embodiment.

In the second embodiment, the burn-in board 20 has an external capacitor connected to the first wiring systems $50a_1$ to $50h_{10}$ and/or the second wiring systems $60a$ to $60p$. It differs from the first embodiment in that the burn-in board 20 has an external capacitor, but otherwise the configuration is similar to the first embodiment. Only the differences between the first embodiment and the second embodiment will be described below, and the parts with the same configuration as in the first embodiment are marked with the same symbols and omitted from the explanation.

FIG. 7A illustrates of a wiring circuit of the first wiring $50a_1$ between the connector 80 and the socket $70A_1$. FIG. 7B illustrates the wiring circuit of the first wiring $50a_{10}$ between the connector 80 and the socket $70A_{20}$. The first wiring system $50a_1$ has the wiring $51a_1$ that connects the branch point of the first wiring system $50a_1$ to the connector 80. A first capacitor 111C is connected to the wiring $51a_1$. The wiring system $a_{10}$ has the wiring $51a_{10}$ that connects the branch point of the first wiring system $50a_{10}$ to the connector 80. A second capacitor 112C is connected to the wiring $51a_{10}$. The capacitance of the first capacitor 111C is greater than that of the second capacitor 112C. A connection point of the second capacitor 112C is not limited to downstream of the compensation circuit 90 as shown in FIG. 7B, but can also be upstream of the compensation circuit 90.

The socket $70A_1$ has a plurality of contact pins, and the plurality of contact pins are arranged to correspond to the terminals of the DUT 100. The contact pins are densely arranged to correspond to multiple channels. Other sockets $70A_2$ to $70P_{20}$ similarly has contact pins.

The contact pins of sockets $70A_1$ to $70P_{20}$ are densely arranged, so the adjacent distance between pins is short. The adjacent distances between the wires of the first wiring systems $50a_1$ to $50h_{10}$ and the second wiring systems $60a$ to $60p$ are shorter depending on their location on the circuit board 30. Crosstalk occurs as the adjacency distance between pins and wires becomes shorter. Such crosstalk occurs especially with high-frequency signals. On the other hand, the shorter the rise and/or fall time required for the test signal, the more high-frequency components the test signal contains. To suppress crosstalk, the high-frequency components of the test signal should be reduced, but the rise and/or fall time will become longer. There is a trade-off between crosstalk and the rise/fall time of the test signal. Furthermore, as shown in the first embodiment, the rise/fall time of the test signal is also affected by the length of the wiring.

In this embodiment, the first capacitor 111C is connected to wiring $51a_1$ and the second capacitor 112C is connected to wiring $51a_{10}$ so that the rise and/or fall time of the test signal is within the required time while suppressing crosstalk, depending on the wiring length.

Figure 8A:
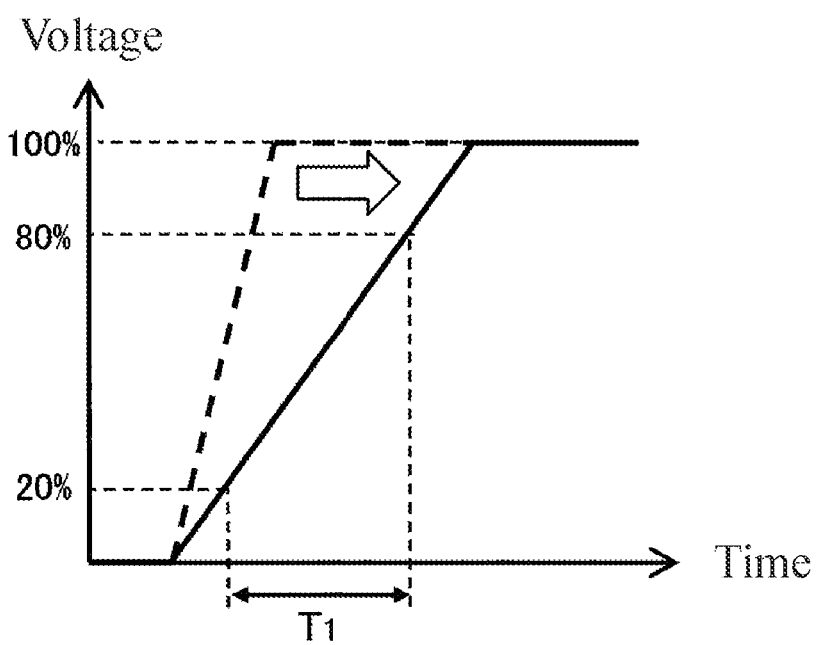
FIGS. 8A-8B are graphs illustrating the rise time of signals transmitting through the wiring circuits in FIGS. 7A-7B.
Figure 8B:
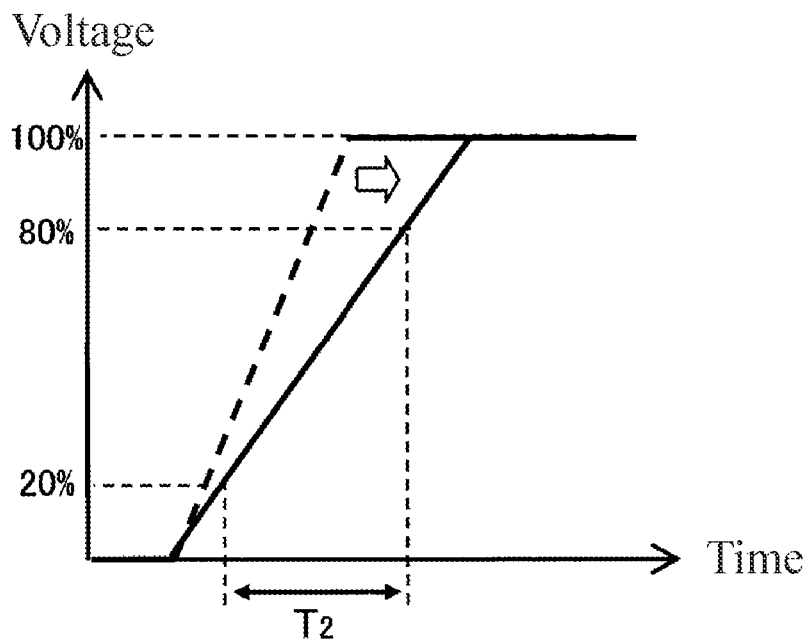

FIG. 8A illustrates the voltage characteristics of the signal transmitted through wiring $51a_1$, and FIG. 8B shows the voltage characteristics of the signal transmitted through wiring $51a_{11}$. The dotted line graphs in FIGS. 8A-8B show the voltage characteristics of the signals when the first and second capacitors 111C and 112C are not connected. The solid line graphs show the voltage characteristics of the signals when the first and second capacitors 111C and 112C are connected.

When crosstalk occurs due to a short rise time of the test signal and including many high-frequency components, the external capacitors, which correspond to capacitors 111C and 112C, are connected to wiring $51a_1$ and $51a_{10}$. The wiring length of wiring $51a_1$ is short and the signal attenuation is small, resulting in a short rise time (referring to the dotted line graph of FIG. 8A). Therefore, the first capacitor 111C with large capacitance is connected to the wiring $51a_1$. As shown in the solid line graph in FIG. 8A, the rise time ($T_1$) is increased by the first capacitor 111C.

The wiring length of wiring $51a_{10}$ is long and the signal attenuation is large, resulting in a long rise time (referring to the dotted line graph of FIG. 8B). Therefore, the second capacitor 112C with small capacitance is connected to the wiring $51a_{10}$. As shown in the solid line graph in FIG. 8B, the rise time ($T_1$) is increased by the second capacitor 112C. However, due to the smaller capacitance, the adjustment range of the rise time by connecting the second capacitor 112C is shorter than that of the first capacitor 111C. Since the rise time ($T_2$) is longer and the high-frequency component of the test signal is suppressed, crosstalk can be suppressed.

Therefore, in the present embodiment, the burn-in board 20 and the burn-in apparatus 1 comprises the external capacitor including the first capacitor 111C and the second capacitor 112C connected to the first wiring system $50a_1$ and $50a_{10}$. The first wiring system $50a_1$ and $50a_{10}$ connect a plurality of sockets $70_{A1}$, $70_{A2}$ and the connector 80, and has a plurality of wirings of which wirings length are different.

The first capacitor 111C is connected to the wiring $51a_1$ of the shorter wiring length, and the second capacitor 112C is connected to the wiring $51a_{10}$ of the longer wiring length. It is possible to suppress a crosstalk and shorten the rise time and/or the fall time of the signal.

Note that the external capacitor may be connected not only to the first wiring system $50a_1$ and $50a_{10}$, but also to other first wiring systems $50a_2$ to $50a_9$ and $50b_1$ to $50h_{10}$. In this case, the shorter the wiring length of the wires, the larger the capacitance of the capacitor may be.

The above embodiments are described to facilitate understanding of the invention and are not intended to limit the invention. Therefore, each element disclosed in the above embodiments is intended to include all design changes and equivalents that fall within the technical scope of the invention.

For example, the configuration of burn-in device 1 described above is only one example and is not specifically limited to the above. For example, the burn-in device 1 described above uses a thermostatic room or chamber 111 to control the DUT 100, but is not limited to this method. For example, the burn-in device 1 may contact the DUT 100 with a temperature adjustment pusher to adjust the temperature of the DUT 100, but this is not limited to this method.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

1 . . . Burn-in apparatus
11 . . . Burn-in chamber
12 . . . Test power supply
13 . . . Burn-in controller
20 . . . Burn-in board
30 . . . Wiring Board
40 . . . Board
41, 42 . . . End
$50a_1$ to $50h_{10}$ . . . First wiring system
$60a$ to $60p$ . . . Second wiring system
70, $70A_1$ to $70P_{20}$ . . . Socket
75A to 75P . . . Socket Row
80 . . . Connector
100 . . . DUT

What is claimed is:

1. A burn-in board comprising:
   a board;
   a socket mounted on the board;
   a connector attached to the board;
   a wiring system that is disposed in the board and that connects the socket and the connector; and
   a compensation circuit that shortens at least one of a rise time and a fall time of a signal transmitted through the wiring system wherein
   the wiring system comprises at least two wirings of different lengths, and
   the compensation circuit connects to a longest one of the wirings but not to a shortest one of the wirings.

2. The burn-in board according to claim 1, wherein
   the compensation circuit has a filter that reduces an amplitude on a low-frequency side of the signal to be less than an amplitude on a high-frequency side of the signal.

3. The burn-in board according to claim 1, further comprising:
   an external capacitor that connects to the wring system.

4. The burn-in board according to claim 1, further comprising:
   an external capacitor that connects to the wring system and that includes a first capacitor and a second capacitor, wherein
   the first capacitor has a capacitance greater than a capacitance of the second capacitor,
   the first capacitor connects to the shortest one of the wirings, and
   the second capacitor connects to the longest one of the wirings.

5. The burn-in board according to claim 1, wherein
   the signal is a test signal for a device under test (DUT) electrically connects to the socket, and
   a frequency characteristic compensated by the compensation circuit is set based on the rise time or the fall time required for the test signal.

6. A burn-in apparatus comprising the burn-in board according to claim 1.

* * * * *